United States Patent [19]

Tonai et al.

[11] Patent Number: 5,452,389

[45] Date of Patent: Sep. 19, 1995

[54] SEMICONDUCTOR ELEMENT MODULE

[75] Inventors: Ichiro Tonai; Osamu Akita, both of Osaka, Japan

[73] Assignee: Sumitomo Electric Industries, Ltd., Japan

[21] Appl. No.: 224,714

[22] Filed: Apr. 8, 1994

[30] Foreign Application Priority Data

Apr. 16, 1993 [JP] Japan .................................. 5-090059

[51] Int. Cl.⁶ .................................................. G02B 6/36
[52] U.S. Cl. .......................................... 385/92; 385/93; 385/88
[58] Field of Search ...................... 385/92, 93, 88, 89, 385/90, 91, 119

[56] References Cited

U.S. PATENT DOCUMENTS

| | | | |
|---|---|---|---|
| 4,790,618 | 12/1988 | Abe | 385/93 |
| 5,127,072 | 6/1992 | Blauvelt et al. | 385/88 |
| 5,146,526 | 9/1992 | Sweeney et al. | 385/90 |
| 5,215,489 | 6/1993 | Nakamura | 385/119 X |
| 5,291,571 | 3/1994 | Kunikane et al. | 385/92 X |
| 5,293,441 | 3/1994 | Tanisawa | 385/92 |

FOREIGN PATENT DOCUMENTS

| | | |
|---|---|---|
| 0191328 | 8/1986 | European Pat. Off. . |
| 0261813 | 3/1988 | European Pat. Off. . |
| 0407919 | 1/1991 | European Pat. Off. . |
| 3429282 | 4/1985 | Germany . |
| 4022076 | 1/1992 | Germany . |
| 4-165312 | 6/1992 | Japan ................... 385/92 |

OTHER PUBLICATIONS

Conference Proceedings from the 18th European Microwave Conference, article entitled "Predistortion Linearisation Of Amplifiers For UHF Mobile Radio", by Stewart et al., published Sep. 12, 1988, pp. 1017–1022.

Electronics Letters, vol. 28, No. 20 article entitled "Comparison Of Direct And External Modulation For CATV Lightwave Transmission At 1.5 μm Wavelength", by A. H. Gnauck et al., published Sep. 24, 1992, pp. 1875–1876.

*Primary Examiner*—Rodney B. Bovernick
*Assistant Examiner*—Phan T. H. Palmer
*Attorney, Agent, or Firm*—Beveridge, DeGrandi, Weilacher & Young

[57] ABSTRACT

A semiconductor element module of the invention comprises a sleeve, a stem, a semiconductor light-emitting or light-receiving element, and a converging lens. In the sleeve, a fitting portion in which a ferrule for positioning an optical fiber is to be fitted is formed from its one open end toward the interior, an element housing portion coaxial with the fitting portion is formed from the other open end toward the interior, and a lens holding portion is formed to connect the fitting portion and the element housing portion. The stem is fixed to the sleeve at the other open end. The semiconductor light-emitting or light-receiving element is fixed on a surface of the stem on the element housing portion side. The converging lens is housed in the element housing portion and fixed to the sleeve, and optically couples an end face of the optical fiber to the light-emitting end face of the semiconductor light-emitting element or the light-receiving end face of the semiconductor light-receiving element. The material constituting the sleeve includes a metal having a thermal expansion coefficient close to that of a material constituting the converging lens.

8 Claims, 3 Drawing Sheets

SEMICONDUCTOR ELEMENT MODULE

BACKGROUND OF THE INVENTION

1. Field of the Invention

The present invention relates to a semiconductor element module used in a reception unit and a transmission unit in an optical communication system.

2. Related Background Art

An optical communication system using an optical fiber technique has been attracting attention in recent years. Since light-emitting and light-receiving elements are generally very small and are inconvenient for use as they are, they are usually provided in a semiconductor element module. A sleeve is formed in this semiconductor element module to connect this module to a ferrule having an optical fiber inserted therein.

A light-emitting diode is generally used as a light-emitting element. Since emitted light diffuses, the light is generally converged by a lens and guided into the optical fiber. Since light emitting from the end face of the optical fiber also diffuses, a lens must be provided between the optical fiber and the light-receiving element, thereby improving the ratio of light guided to the light-receiving element.

Hence, a lens must be provided between a semiconductor element, e.g., a light-emitting or light-receiving element, and the optical fiber. An example of a conventional module has a structure in which a lens is directly provided with a semiconductor element (e.g., Japanese Patent Laid-Open No. 4-165312 and the like). Another example has a structure in which a lens is provided in a module. When a lens is provided in a module, a metal holder 101 holding a lens 120 therein, as shown in FIG. 1, is mounted to a sleeve (not shown) which is formed separately from the metal holder 101. To hold a lens in a metal holder, a lens is held on a metal cylinder or the like.

At this time, SUS430, which is a material having a thermal expansion coefficient close to that of a glass material constituting the lens, is used as the material of the cylinder holding the lens. SUS303-based material having a good machining performance is used as the material constituting the sleeve.

Alternatively, as shown in FIG. 2, a light-emitting element is hermetically sealed by using a cap 201 that fixes a lens 220, and the cap 201 is mounted to a sleeve.

SUMMARY OF THE INVENTION

It is an object of the present invention to provide a semiconductor element module for optical communication which has a small number of components and a high endurance against a connecting/disconnecting operation and which can be aligned easily.

According to the present invention, there is provided a semiconductor element module comprising: a sleeve with a first hollow portion, in which a ferrule for positioning an optical fiber is to be fitted, is formed having a first open end which extends toward an interior; a second hollow portion coaxial with the first hollow portion, is formed from a second open end thereof toward the interior; and a third hollow potion is formed to link the first and second hollow portions; a stem fixed to the sleeve at the second open end; a semiconductor light-emitting or light-receiving element fixed on a surface of the stem on the second hollow portion side; and a converging lens, housed in the third hollow portion and fixed to the sleeve, for optically coupling an end face of the optical fiber to a light-emitting end face of the semiconductor light-emitting element or a light-receiving end face of the semiconductor light-receiving element, wherein the sleeve is integrally formed using a metal having a thermal expansion coefficient close to that of a material constituting the converging lens (within 30%).

In the above semiconductor element module, the sleeve is preferably made of a corrosion-resistant metal, stainless steel, ferrite-based stainless steel, an SUS430-based metal, an SUS430F metal, or a metal having a nature corresponding to that of the aforementioned metals.

The converging lens is preferably made of BK7 optical glass. TaF-3, HE-2, K-2, LF-5, F-3, SF-2, and LaF-3 optical glass are also usable.

The converging lens is preferably hermetically fixed to close the third hollow portion, and the stem is preferably hermetically fixed to close the second open end. The converging lens is preferably fixed to the lens holding portion with a low-melting point glass or an inorganic or organic glue.

According to the above arrangement, since the third hollow portion holding the lens and the first hollow portion in which the ferrule is to be inserted are integrally formed as a sleeve, they are coaxial positioned relative to each other at high precision. Therefore, the centering operation of the optical fiber, the lens, and the semiconductor element, which operation is required when the optical fiber is fitted in the sleeve through the ferrule and the stem fixing the semiconductor element (a light-emitting or light-receiving element) is mounted to the sleeve, can be performed easily. Since the first and second hollow portions are integrally formed as the sleeve by using the same material, the number of components can be decreased.

Furthermore, since the thermal expansion coefficient of the material constituting the sleeve and that of the material constituting the lens are close to each other, even if the module is exposed to a large temperature change, a gap will not be formed between the sleeve and the lens, and the material glueing the lens and the sleeve will not be separated.

When the lens and the stem are fixed to the sleeve in contact therewith, the air-tightness of the second hollow portion housing the semiconductor element is maintained. Hence, impurities will not enter the second hollow portion from the outside.

If ferrite-based stainless steel, a SUS430-based metal, a SUS430F metal, or a metal having a nature corresponding to that of these metals is used as the material of the sleeve, cohesion of the sleeve and the ferrule can be avoided.

As described above, according to the present invention, since the third hollow portion holding the lens and the first hollow portion are integrally formed as the sleeve from the same material, the centering operation of the optical fiber, the lens, and the semiconductor element, which operation is required when the optical fiber is fitted in the first hollow portion and the stem fixing the semiconductor element (light-emitting or light-receiving element) is mounted to the sleeve, can be easily performed, and the optical axes of these components can be aligned with high precision. Also, the number of components can be decreased. Therefore, the manufacturing cost can be decreased, and the yield can be increased.

Since the thermal expansion coefficient of the material constituting the sleeve and that of the material constituting the lens are close to each other, even if a large temperature change occurs, a gap will not be formed between the sleeve and the lens, and the material adhering the lens and the sleeve will not be separated. Therefore, the air-tightness of the second hollow portion can be maintained even if a large temperature change takes place.

Since the lens and stem are fixed to the sleeve in tight contact therewith, the air-tightness of the second hollow portion is maintained. Hence, impurities will not enter the second hollow portion from the outside. Therefore, a semiconductor element module having a high reliability can be obtained.

If ferrite-based stainless steel, the SUS430-based metal, the SUS430F metal, or a metal having a nature corresponding to that of these metals is used as the material of the sleeve, cohesion of the sleeve and the ferrule can be avoided.

Thus, according to the present invention, a high-reliability, low-cost, high-performance semiconductor element module can be provided.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE INVENTION

Figure 1:
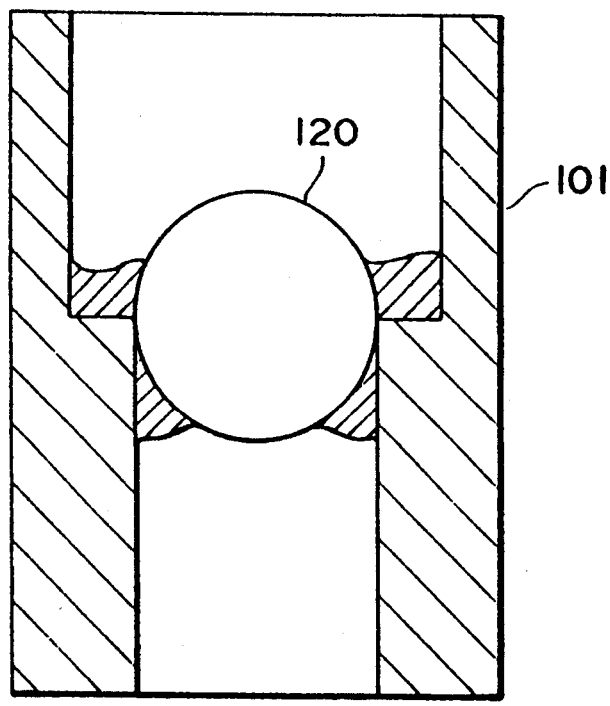
FIG. 1 is a diagram of a conventional semiconductor element module.
Figure 2:
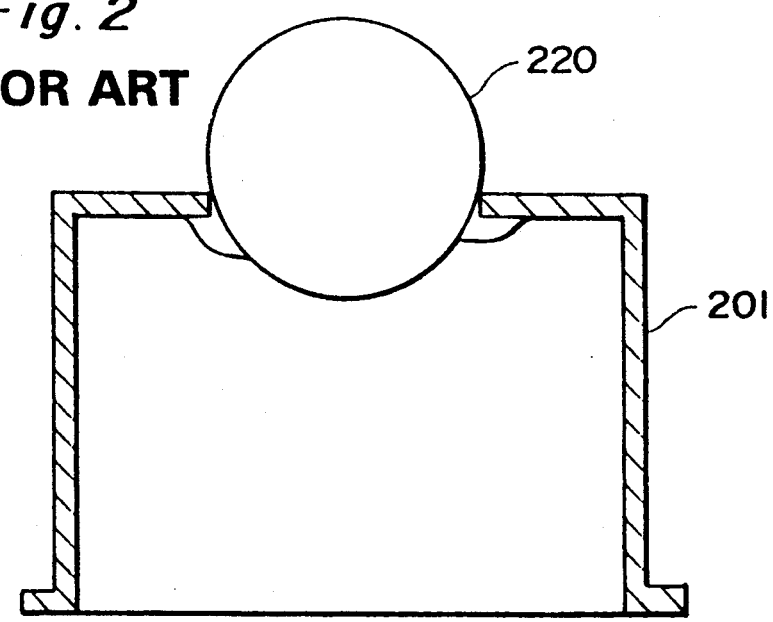
FIG. 2 is a diagram of another conventional semiconductor element module.

The embodiment of the present invention will be described with reference to the accompanying drawings. In the description of the drawings, the same elements will be denoted by the same reference numerals.

The embodiment of the present invention will be described with reference to FIGS. 3 and 4.

Figure 3:
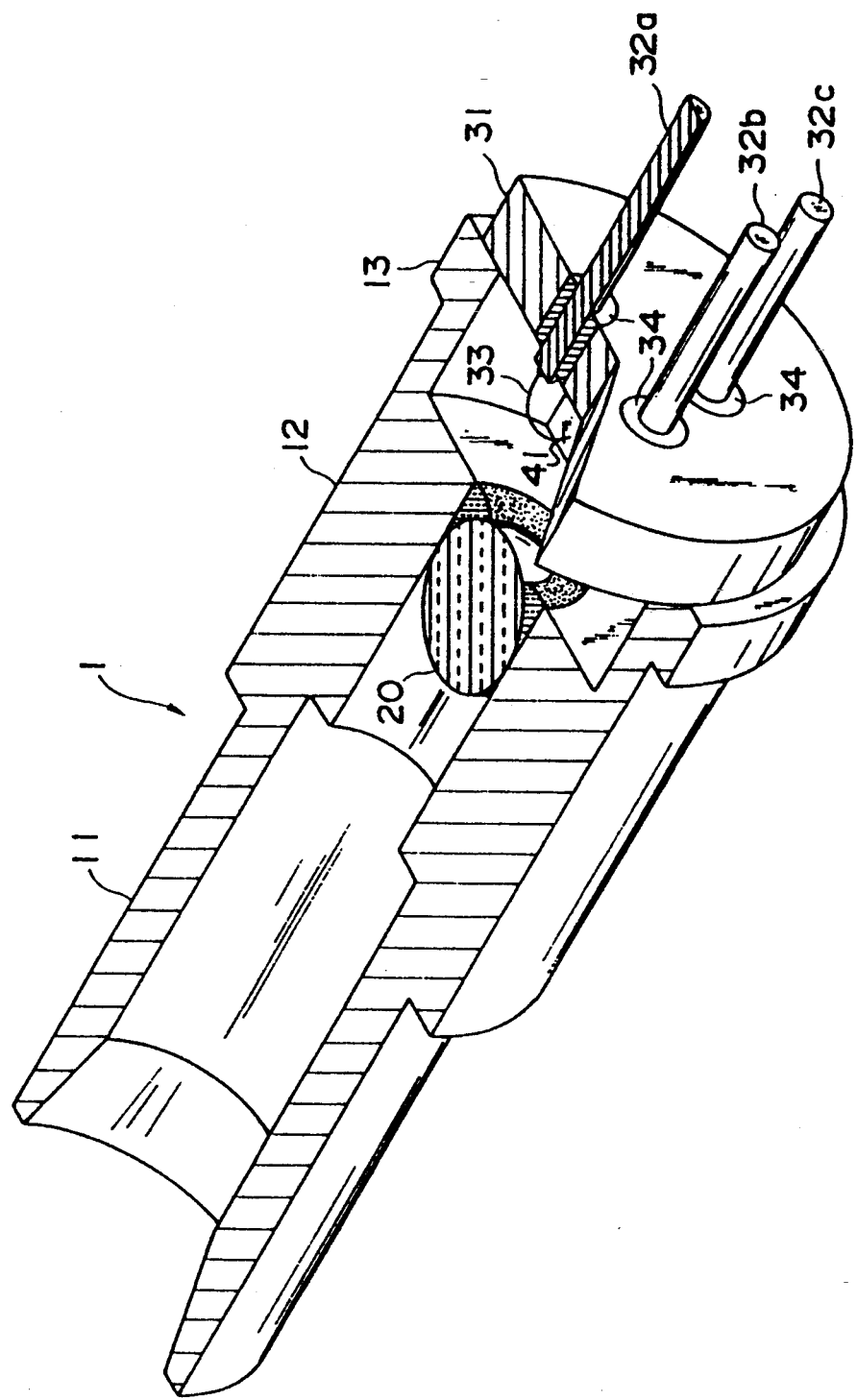
FIG. 3 is a cut-away perspective view of a semiconductor element module according to an embodiment of the present invention.
Figure 4:
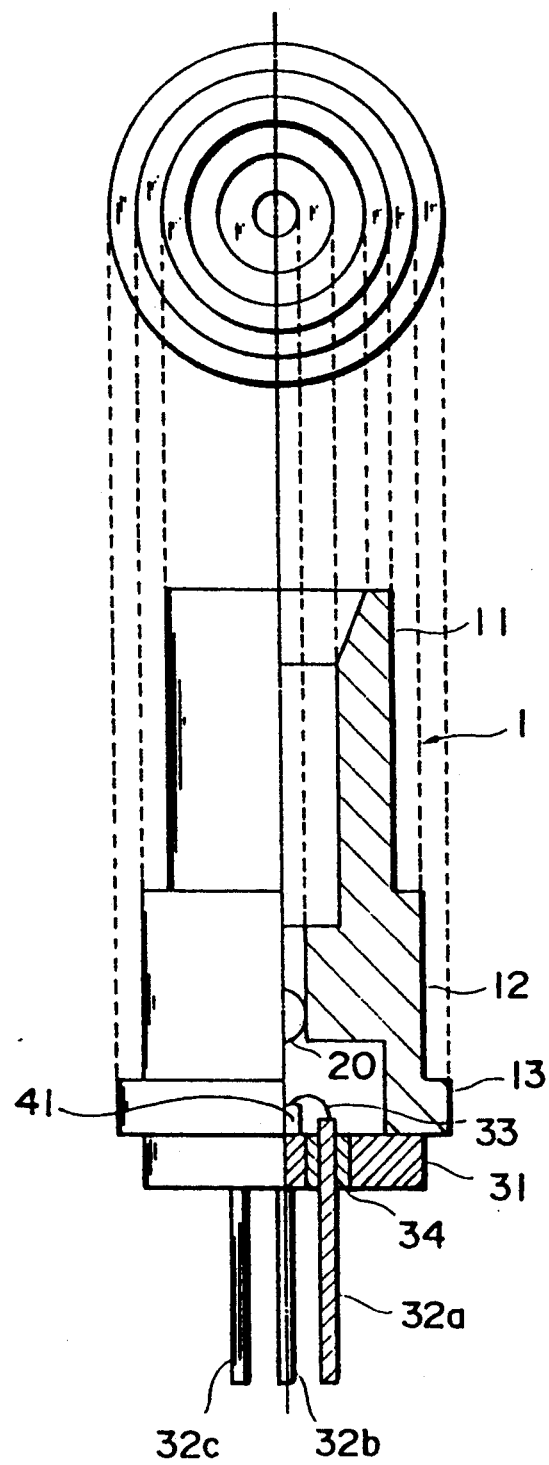
FIG. 4 is a diagram of the semiconductor element module according to the embodiment of the present invention.

As shown in FIGS. 3 and 4, a fitting portion 11 serving as the first hollow portion in which an optical fiber positioning ferrule is to be fitted is formed in a sleeve 1 from one open end toward its interior. An element housing portion 13 serving as the second hollow portion coaxial with the fitting portion 11 is formed in the sleeve 1 from the other open end toward its interior. The inner diameter of the element housing portion 13 is larger than that of the fitting portion 11. A lens holding portion 12 serving as the third hollow portion is defined in the sleeve 1 and links the first and second hollow portions. The inner diameter of the lens holding portion 12 is smaller than that of the fitting portion 11. The sleeve 1 may be made of SUS430F metal.

The inner circumferential surface of a distal end portion of the fitting portion 11 is formed in a tapered manner to be wider toward the outer portion. This aims at facilitating fitting of the ferrule. In other words, the distal end portion is tapered so that it functions as a ferrule guide.

The wall of the lens holding portion 12 is thicker than that of the fitting portion 11, and a ball lens 20 is fixed in the inner side of the lens holding portion 12 with a low-melting point glass. The low-melting point glass is a glass to which selenium, thallium, arsenic, or sulfur is added to give a low melting point. The lens material of the ball lens 20 may be BK7 optical glass. The material for fixing the ball lens 20, may be an organic glue, an inorganic glue, or the like, used in place of the low-melting glass.

A disk-shaped stem 31 is fixed to the open end of the sleeve 1 on the element housing portion 13 side by projection welding.

The element housing portion 13 is hermetically maintained, and its interior is a dry $N_2$ gas atmosphere. When the element housing portion 13 is hermetically maintained in this manner, dust or a corrosive gas will not enter the element housing portion 13 from the outside, thereby maintaining a high reliability.

As a method of glueing the stem 31 to the sleeve 1, a solder sealing method, or the like, are available in addition to projection welding. The interior of the element housing portion 13 is not limited to the $N_2$ gas atmosphere but can be other inert gas atmospheres, e.g., an Ar gas atmosphere, or can be set at a vacuum state.

The stem 31 is obtained by plating Ni to cold-rolled steel and plating Au to the Ni-plated cold-rolled steel. A semiconductor light-emitting element 41 is placed on the upper surface of the stem 31. Three stem pins 32a, 32b, and 32c are attached to predetermined positions, as shown in FIG. 3, of the stem 31 respectively through seal tubes 34. The upper ends of the stem pins 32a, 32b, and 32c projecting through the upper surface of the stem 31 are connected to the semiconductor light-emitting element 41 respectively through wires 33. The stem pin 32b may be directly welded to the stem 31 to serve as a ground terminal, thereby providing an electromagnetic shield effect.

As described above, according to the semiconductor element module of this embodiment, since the fitting portion 11 and the lens holding portion 12 of the sleeve 1 are integrally formed from the same material, one centering operation is sufficient for aligning the light-emitting element and the optical fiber. More specifically, the ball lens 20 can be positioned by fixing it in the lens holding portion 12 of the sleeve 1, and centering can be performed by fitting the ferrule having an optical fiber in the fitting portion 11 and aligning the stem 31, to which the semiconductor light-emitting element 41 is fixed, to the open end of the sleeve 1. Thus, the centering operation is simple, increasing yield, and reducing machining cost. Also, since the entire structure is made of a same material, the number of components can be decreased.

To form the sleeve 1 as indicated in the above embodiment, it may be formed in accordance with, e.g., coaxial machining by using an NC lathe. When coaxial machining is performed by using the NC lathe, the coaxial degree of the fitting portion 11 and the lens holding portion 12 can be increased. When the coaxial degree of the fitting portion 11 and the lens holding portion 12 is increased, the optical axis of the optical fiber and the center of the ball lens 20 can be aligned at a high precision by fitting and fixing the ball lens 20 in the lens holding portion 12.

In the above embodiment, SUS430F metal is used as the material of the sleeve 1. However, a corrosion-resistant metal, stainless steel, ferrite-based stainless steel, an SUS430-based metal, an SUS430F metal, or a metal having a nature corresponding to that of these metals may also be used. Of these materials, when ferrite-based stainless steel, an SUS430-based metal, an SUS430F metal, or a metal having a nature corresponding to that of these metals, which are represented by SUS430F, is used, cohesion of the ferrule and the sleeve can be prevented even if the connecting/disconnecting operation of the ferrule is repeated.

As the material of the ball lens 20, BK7 optical glass is used. However, any other material can be used as far as it has a thermal expansion coefficient close to that of the metal constituting the sleeve. In other words, the material of the ball lens may be determined first and a metal having a thermal expansion coefficient $k_2$ close to that of the material of the ball lens may be selected to form the sleeve. Or, the metal of the sleeve may be determined first and a material having a thermal expansion coefficient ($k_1$) close to that of the metal of the sleeve may be selected to form the ball lens which expressed by the following equation $$\frac{k_1 - k_2}{k_1} < 30\%.$$

When the thermal expansion coefficients of the ball lens and the metal forming the sleeve are close, even if a large temperature change occurs, a gap will not be formed between the ball lens and the lens holding portion, and the material which adheres the ball lens and the lens holding portion will not be removed. As a result, the air-tightness in the element housing portion 13 can be maintained even if a large temperature change occurs.

If a light-receiving element is housed in the element housing portion 13 described in the above embodiment, the module can be used as the light-receiving element module. In this case, the ball lens converges the light from the optical fiber onto the light-receiving end face of the light-receiving element.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor element module comprising:
   a sleeve having a first hollow portion defining a first open end thereof, which hollow portion extends toward an interior portion of said sleeve wherein, a ferrule for positioning an optical fiber is adapted to fit in said first hollow portion, a second hollow portion defined in a second end of said sleeve, said second hollow portion being coaxial with the first hollow portion and formed having a second open end which is opposite to said first open end, said second hollow portion extending toward the interior portion of said sleeve, and a third hollow portion formed to link the first and second hollow portions, said sleeve consisting of a metal selected from the group consisting of ferrite-based stainless steel, SUS430-based metal, SUS430F metal, and a metal having characteristics corresponding to that of ferrite-based stainless steel, SUS430-based metal, and SUS430F metal;
   a stem hermetically fixed to said sleeve and sealing the second open end thereof;
   an optical active element fixed on a surface of said stem; and
   a converging lens, housed in the third hollow portion and hermetically fixed to said sleeve in order to seal said third hollow portion, for optically coupling an end face of said optical fiber to a light-emitting or light-receiving end face of said optical active element, wherein
   said sleeve is integrally formed using said metal having a thermal expansion coefficient which has a correlation expressed by the following equation with a thermal expansion coefficient of a material constituting said converging lens:

$(k_1 - k_2)/k_1 < 30\%$ $k_1$: a thermal expansion coefficient of the sleeve $k_2$: a thermal expansion coefficient of the lens.

2. A module according to claim 1, wherein said sleeve consists of a corrosion-resistant metal.

3. A module according to claim 1, wherein said sleeve consists of a material selected from the group consisting of SUS430-based metal and a metal having characteristics corresponding to that of SUS430-based metal.

4. A module according to claim 1, wherein said converging lens consists of a material selected from the group consisting of BK7, TaF-3, HE-2, K-3, LF-5, F-3, SF-2, and LaF-3 optical glass.

5. A module according to claim 1, wherein said sleeve consists of a material selected from the group consisting of SUS430F metal and a metal having characteristics corresponding to that of SUS430F metal.

6. A module according to claim 1, wherein said converging lens is fixed to the third hollow portion with a material selected from the group consisting of a low-melting point glass, an inorganic glue, and an organic glue.

7. A module according to claim 1, wherein said optical active element is a semiconductor light-emitting element.

8. A module according to claim 1, wherein said optical active element is a semiconductor light-receiving element.

* * * * *